US011937391B2

(12) United States Patent
Gong et al.

(10) Patent No.: US 11,937,391 B2
(45) Date of Patent: Mar. 19, 2024

(54) ROTARY SHAFT APPARATUS AND FOLDABLE ELECTRONIC DEVICE

(71) Applicant: Beijing Xiaomi Mobile Software Co., Ltd., Beijing (CN)

(72) Inventors: Shenghan Gong, Beijing (CN); Xuehu Zhang, Beijing (CN); Bowen Shan, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/815,081

(22) Filed: Jul. 26, 2022

(65) Prior Publication Data

US 2023/0320006 A1    Oct. 5, 2023

(30) Foreign Application Priority Data

Mar. 31, 2022  (CN) .......................... 202210344923.3

(51) Int. Cl.
  *H05K 5/02*  (2006.01)
  *G06F 1/16*  (2006.01)

(52) U.S. Cl.
  CPC ......... *H05K 5/0226* (2013.01); *G06F 1/1616* (2013.01)

(58) Field of Classification Search
  CPC ..... H05K 5/0226; F16C 11/04; G06F 1/1616; G06F 1/1618; G06F 1/1681; E05Y 2900/606; E05D 3/18; E05D 3/122
  See application file for complete search history.

(56) References Cited

U.S. PATENT DOCUMENTS

| | | | | |
|---|---|---|---|---|
| 9,557,771 B2* | 1/2017 | Park | ................... | G06F 1/1681 |
| 11,129,287 B2* | 9/2021 | Hsu | ................... | H05K 7/1401 |
| 11,194,366 B2* | 12/2021 | Cheng | ................. | G06F 1/1652 |
| 11,243,578 B2* | 2/2022 | Torres | ................. | G06F 1/1616 |
| 11,336,759 B2* | 5/2022 | Liao | ..................... | H04M 1/022 |
| 11,385,686 B2* | 7/2022 | Ai | ........................ | G06F 1/1616 |
| 11,659,073 B1* | 5/2023 | Hsu | ..................... | H04M 1/022 16/221 |
| 2020/0103935 A1* | 4/2020 | Hsu | ..................... | G06F 1/1681 |
| 2020/0310497 A1* | 10/2020 | Hsu | ......................... | E05D 3/18 |
| 2021/0026418 A1* | 1/2021 | Park | ........................ | E05D 3/14 |
| 2021/0173449 A1* | 6/2021 | Yao | ..................... | G06F 1/1616 |
| 2021/0181808 A1* | 6/2021 | Liao | ..................... | G06F 1/1641 |

(Continued)

FOREIGN PATENT DOCUMENTS

WO    2021129882 A1    7/2021

OTHER PUBLICATIONS

EP 4072110A1 (Year: 2023).*

*Primary Examiner* — Sagar Shrestha
(74) *Attorney, Agent, or Firm* — McCoy Russell LLP

(57) ABSTRACT

A rotary shaft apparatus includes a base plate and a rotary shaft assembly; the rotary shaft assembly includes a first transmission assembly, a second transmission assembly and a first supporting member; the first transmission assembly is rotatably connected to the base plate around a first axial direction; the first supporting member is rotatably connected to the first transmission assembly around a second axial direction parallel to the first axial direction, and is movably connected to the second transmission assembly; the second transmission assembly is rotatably connected to the base plate around a third axial direction parallel to the first axial direction.

20 Claims, 10 Drawing Sheets

(56) References Cited

U.S. PATENT DOCUMENTS

| | | | |
|---|---|---|---|
| 2021/0240232 A1* | 8/2021 | Cheng | H04M 1/022 |
| 2021/0271294 A1* | 9/2021 | Liao | G06F 1/181 |
| 2022/0137675 A1* | 5/2022 | Kuramochi | G06F 1/1641 |
| | | | 361/679.27 |
| 2022/0217859 A1* | 7/2022 | Lee | H04M 1/02 |
| 2023/0032306 A1* | 2/2023 | Feng | G06F 1/1656 |
| 2023/0143511 A1* | 5/2023 | Xi | G06F 1/1652 |
| | | | 361/679.27 |
| 2023/0244274 A1* | 8/2023 | Lin | G06F 1/1652 |
| | | | 361/679.27 |
| 2023/0262150 A1* | 8/2023 | Wu | G06F 1/1652 |
| | | | 455/575.3 |

\* cited by examiner

ROTARY SHAFT APPARATUS AND FOLDABLE ELECTRONIC DEVICE

CROSS-REFERENCE TO RELATED APPLICATION

The present application claims priority to Chinese Patent Application No. 202210344923.3, filed on Mar. 31, 2022. The entire contents of the above-listed application are hereby incorporated by reference for all purposes.

BACKGROUND

Owing to development of a flexible organic light-emitting diode (OLED) display technology, mobile terminals have been developing towards foldable electronic devices for their portability like ordinary electronic devices and amazing experience of display from unfolded large-screens, for which keen competition has been heated up among major terminal manufacturers. In most cases of switching states of the foldable electronic devices by hinges, the electronic devices are folded or unfolded by folding or unfolding the hinges.

SUMMARY

The disclosure provides a rotary shaft apparatus and a foldable electronic device, so as to overcome defects in the related art.

A first aspect of an example of the disclosure provides a rotary shaft apparatus. The rotary shaft apparatus includes: a base plate and a rotary shaft assembly, the rotary shaft assembly includes a first transmission assembly, a second transmission assembly and a first supporting member; the first transmission assembly is rotatably connected to the base plate around a first axial direction; the first supporting member is rotatably connected to the first transmission assembly around a second axial direction parallel to the first axial direction, and is movably connected to the second transmission assembly; and the second transmission assembly is rotatably connected to the base plate around a third axial direction parallel to the first axial direction.

A second aspect of an example of the disclosure provides a foldable electronic device. The foldable electronic device includes a middle frame housing, a flexible display screen, and the rotary shaft apparatus described in the first aspect, the flexible display screen being connected to the middle frame housing, the first transmission assembly being connected to the middle frame housing.

It should be understood that the above general description and the following detailed description are illustrative and explanatory, and may not limit the disclosure.

BRIEF DESCRIPTION OF THE DRAWINGS

The accompanying drawings herein, which are incorporated in the description as a constituent part of the description, illustrate the examples satisfying the disclosure and are used to explain the principles of the disclosure together with the description.

DETAILED DESCRIPTION

The examples will be described in detail herein and shown in the accompanying drawings. When the following descriptions relate to the accompanying drawings, unless otherwise specified, the same numeral in different accompanying drawings denotes the same or similar element. The implementations described in the following examples do not denote all implementations consistent with the disclosure. On the contrary, the implementations are merely examples of apparatuses and methods consistent with some aspects of the disclosure as detailed herein.

The terms used in the disclosure are merely to describe the specific examples, instead of limiting the disclosure. The singular forms such as "a", "the" and "this" used in the disclosure are also intended to include the plural forms, unless otherwise clearly stated in the context. It should also be understood that the term "and/or" used herein refers to and includes any or all possible combinations of one or more of the associated listed items.

It should be understood that although the terms "first", "second", "third", etc. may be employed in the disclosure to describe various information, such information should not be limited to these terms. These terms are merely used to distinguish the same type of information from each other. For example, first information could also be referred to as second information, and similarly, second information could also be referred to as first information, without departing from the scope of the disclosure. Depending on the context, the word "if" as used herein may be interpreted as "in the case of", "under the situation that" or "in response to determining".

A rotary shaft apparatus and a foldable electronic device in examples of the disclosure will be described in detail in combination with the accompanying drawings. The features in the following examples and implementations may be combined with each other without conflict.

The disclosure relates to the technical field of terminals, in particular to a rotary shaft apparatus and a foldable electronic device.

Figure 1:
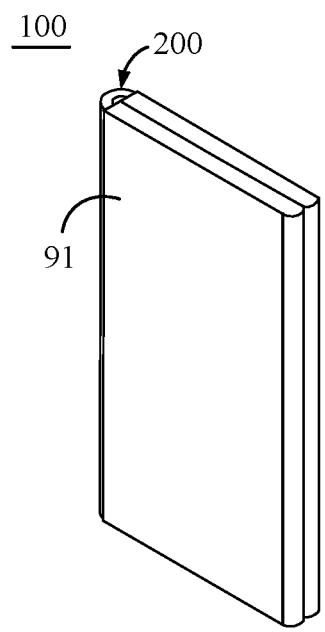
FIG. 1 is a schematic structural diagram of a foldable electronic device in a folded state illustrated according to an example.
Figure 2:
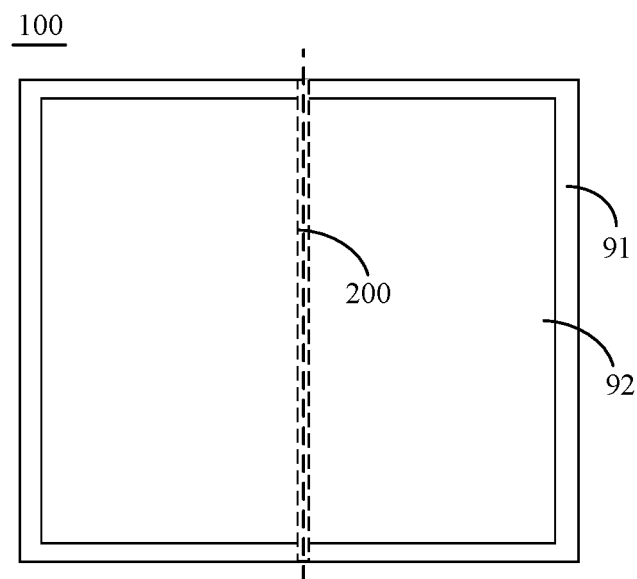
FIG. 2 is a schematic structural diagram of a foldable electronic device in an unfolded state illustrated according to an example.

As shown in FIGS. 1 and 2, an example of the disclosure provides a foldable electronic device 100. The foldable electronic device 100 may be a foldable mobile phone, a tablet computer, a notebook computer, a camera or other foldable terminal devices. The foldable electronic device 100 may include a middle frame housing 91, a flexible display screen 92 and a rotary shaft apparatus 200. The flexible display screen 92 is connected to the middle frame housing 91, the rotary shaft apparatus 200 is mounted in a middle of the middle frame housing 91, and the middle frame housing 91 may rotate by means of the rotary shaft apparatus 200, so as to switch the foldable electronic device 100 between a folded state shown in FIG. 1 and an unfolded state shown in FIG. 2. Specifically, the middle frame housing 91 may include a first housing and a second housing, the flexible display screen 92 is laid on the first housing and the second housing, and the rotary shaft apparatus 200 is mounted between the first housing and the second housing. Any one of the first housing and the second housing may rotate relative to the other one by means of the rotary shaft apparatus 200, so as to drive the flexible display screen 92 to be synchronously folded or unfolded.

As shown in FIGS. 3-7, the rotary shaft apparatus 200 may include a base plate 10 and a rotary shaft assembly 20. The rotary shaft assembly 20 includes a first transmission assembly 21, and the first transmission assembly 21 is connected to the middle frame housing 91, so as to assemble the rotary shaft apparatus 200 to the middle frame housing 91. In some examples, the first transmission assembly 21 is provided with a mounting portion 210, so as to be connected to the middle frame housing 91 by means of the mounting portion 210. The middle frame housing 91 may be correspondingly provided with a connection portion, and through assembly and connection between the connection portion and the mounting portion 210, the first transmission assembly 21 may be mounted on the middle frame housing 91. In the example, the mounting portion 210 includes at least one mounting hole, and the connection portion includes at least one connection hole. For example, the mounting hole and the connection hole each may be at least one of a threaded hole, a rivet hole and an unthreaded hole, the middle frame housing 91 may be provided with a connection hole corresponding to the mounting hole in position, and a fastener such as a screw is inserted into the mounting hole and the connection hole of the middle frame housing 91, so as to mount the first transmission assembly 21 mounted on the middle frame housing 91, and assemble the rotary shaft apparatus 200 to the middle frame housing 91.

It can be understood that one end of the first transmission assembly 21 is rotatably connected to the base plate 10, and the other end of the first transmission assembly 21 is connected to the middle frame housing 91 by means of the mounting portion 210. No additional parts are needed, and a force may be directly transmitted between two components, such that a response speed is higher. When a user rotates any one of the first housing and the second housing, the other one of the first housing and the second housing may be driven to synchronously rotate by means of the rotary shaft apparatus 200 at a higher response speed, so as to realize synchronous folding or unfolding from two sides, driving the flexible display screen 92 to be synchronously bent or unfolded.

Further, the rotary shaft assembly 20 further includes a first supporting member 22 and a second transmission assembly 23. The first transmission assembly 21 is rotatably connected to the base plate 10 around a first axial direction (an X direction shown in the figure). The first supporting member 22 is rotatably connected to the first transmission assembly 21 around a second axial direction parallel to the first axial direction, and is movably connected to the second transmission assembly 23. The second transmission assembly 23 is rotatably connected to the base plate 10 around a third axial direction parallel to the first axial direction. It can be understood that the first axial direction, the second axial direction and the third axial direction may be coaxially set or non-coaxially set.

The first transmission assembly 21 drives, when rotating relative to the base plate 10, the first supporting member 22 to rotate relative to the base plate 10, and the first supporting member 22 drives the second transmission assembly 23 to rotate relative to the base plate 10. In this way, the second transmission assembly 23 is driven to rotate relative to the base plate 10 by the first supporting member 22 such that the rotary shaft assembly 20 may integrally rotate relative to the base plate 10 without an additional transmission structure, saving material cost. The rotary shaft apparatus 200 may be made thinner, such that a design requirement of a miniaturized product is met, and a response speed is higher.

In some examples, the rotary shaft assembly 20 may include at least two first transmission assemblies 21 arranged in a length direction of the base plate 10 at intervals, and the first supporting member 22 is connected to the at least two first transmission assemblies 21. In this way, the first supporting member 22 may be driven to rotate by at least two first transmission assemblies 21 such that a response speed may be higher, and stability of the first supporting member 22 during rotation may be improved. In the example, the rotary shaft assembly 20 including two first transmission assemblies 21 that are arranged on two sides of the first supporting member 22 is taken as an example. It should be noted that the number of the first transmission assemblies 21 may be adjusted according to actual situations, such as a length of the base plate, a length of the first supporting member, an assembly space and a placement position, which is not limited in the disclosure.

Figure 3:
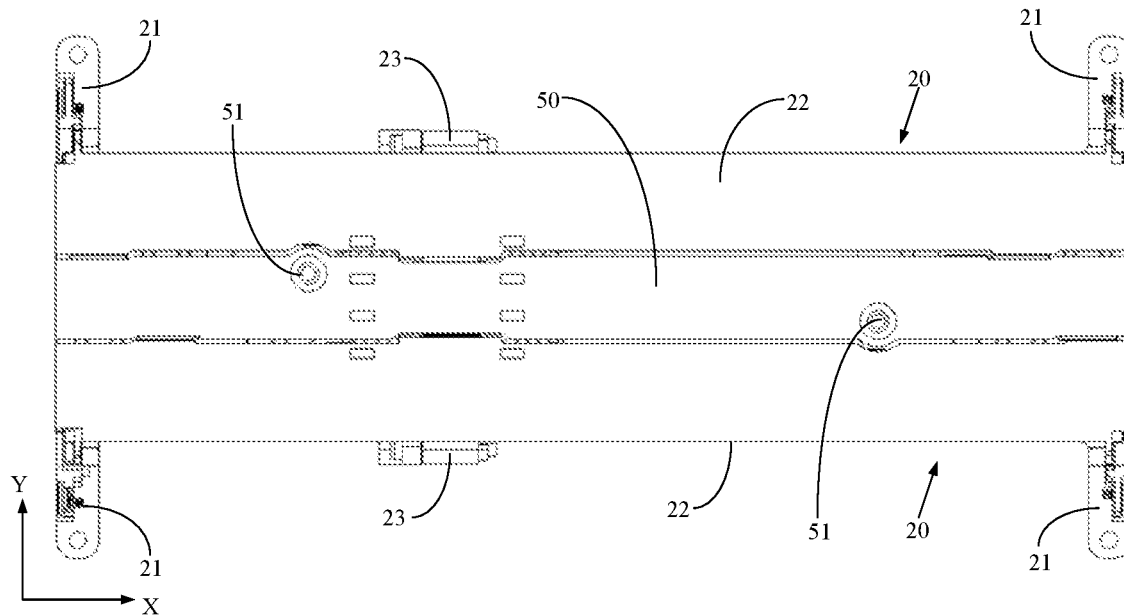
FIG. 3 is a schematic front view of a rotary shaft apparatus illustrated according to an example.
Figure 5:
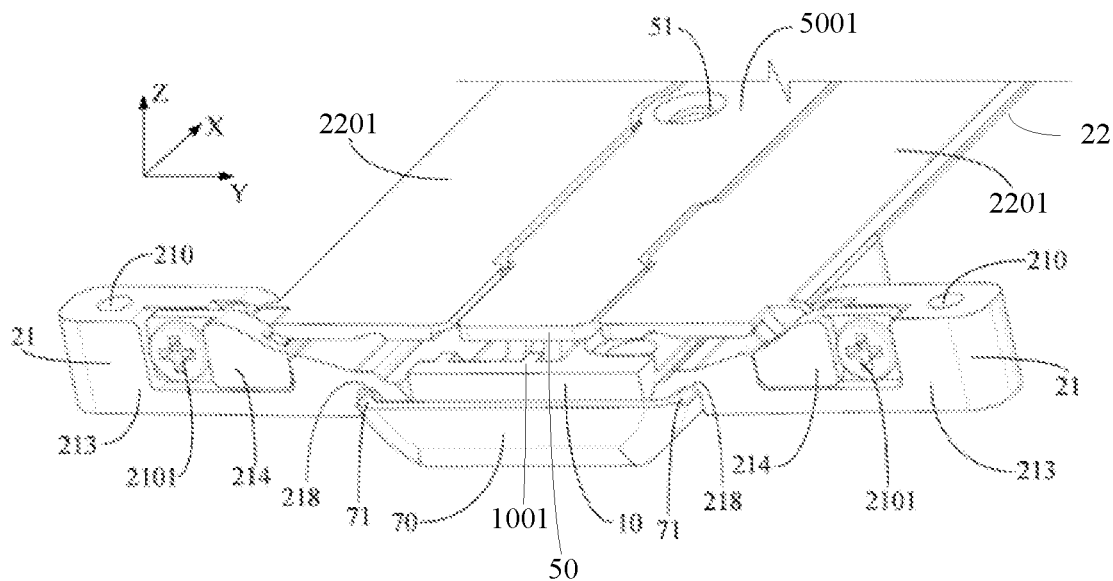
FIG. 5 is a schematic partial view of a rotary shaft apparatus in an unfolded state illustrated according to an example.
Figure 6:
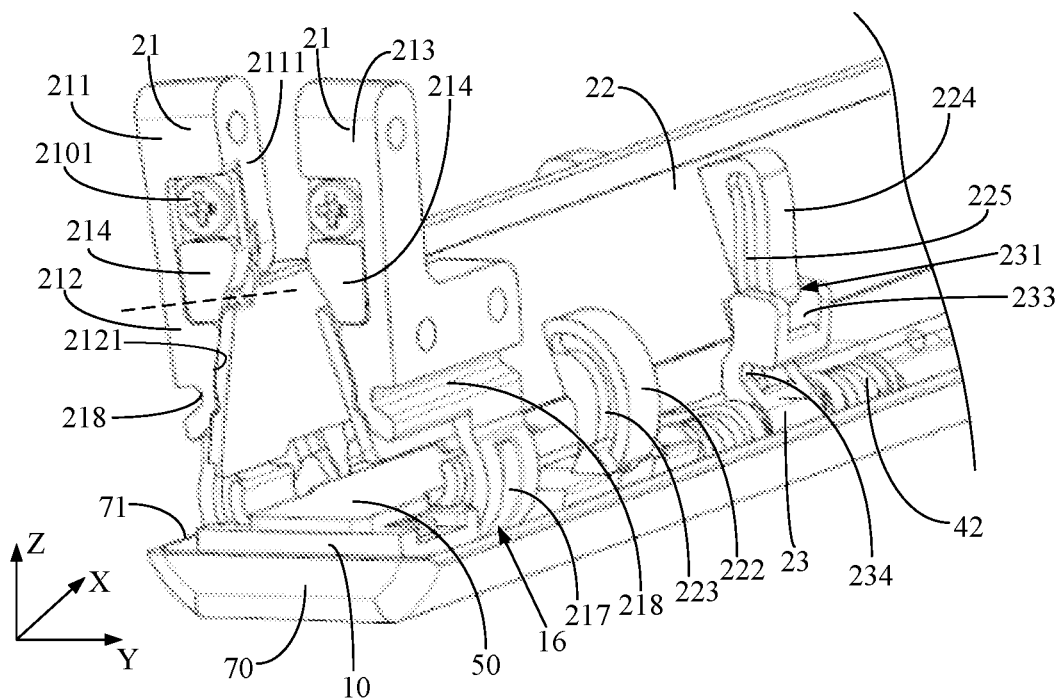
FIGS. 6 and 7 are schematic partial views of a rotary shaft apparatus in a folded state illustrated according to an example.
Figure 7:
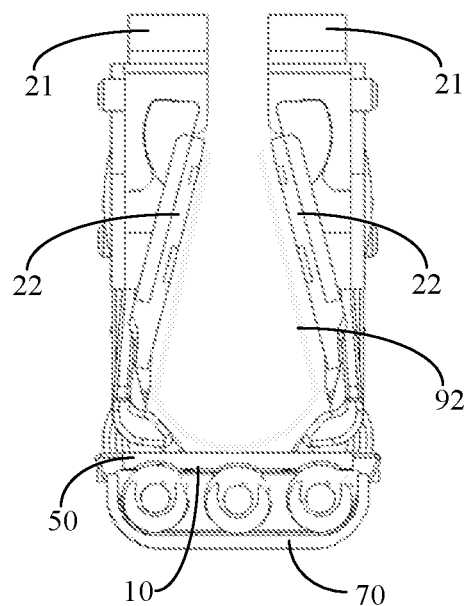

In some examples, the base plate 10 includes a first supporting plane 1001 (an upper surface shown in FIG. 5), and the first supporting member 22 includes a second supporting plane 2201 (an upper surface shown in FIG. 5). The rotary shaft apparatus 200 has an unfolded state and a folded state. As shown in FIGS. 3 and 5, when the rotary shaft apparatus 200 is in the unfolded state, the second supporting plane 2201 of the first supporting member 22 and the first supporting plane 1001 of the base plate 10 are positioned on the same plane, and may be used for supporting the flexible display screen 92 of the foldable electronic device 100. As shown in FIGS. 6 and 7, a first preset included angle may be formed between the second supporting plane 2201 of the first supporting member 22 and the first supporting plane 1001 of the base plate 10, and the first supporting member 22 and the base plate 10 define a screen-accommodating space. In some examples, the first preset included angle may range from 60 degrees to 75 degrees, and may be adjusted according to actual situations, which is not limited in the disclosure. In an illustrated example, a first preset included angle being 90 degrees is taken as an example. In this way, as shown in FIG. 7, when the rotary shaft apparatus 200 is in the folded state, the base plate 10 and the first supporting member 22 may define a screen-accommodating space in a "drop-like shape", the screen-accommodating space is large and is used for accommodating the flexible display screen 92 of the foldable electronic device 100, such that the flexible display screen 92 may be basically set in a "drop shape" when the foldable electronic device 100 is folded. Compared with a 90-degree folding method in the related art, this method has the effects that a bending angle of the flexible display screen 92 during folding may be reduced, such that creases after the flexible display screen 92 is unfolded is reduced, the flexible display screen is not prone to be broken, and service life is prolonged.

In some examples, the first transmission assembly 21 includes a first supporting surface 2111 and a second supporting surface 2121, and a second preset included angle is formed between the second supporting surface 2121 and the first supporting surface 2111. In some examples, the second preset included angle may be set corresponding to the first preset included angle, may range from 60 degrees to 75 degrees, and may be adjusted according to actual situations, which is not limited in the disclosure.

In the unfolded state, the first supporting surface 2111 and the first supporting plane 1001 of the base plate 10 are positioned on the same plane, and may be used for supporting the flexible display screen. In the folded state, the second supporting surface 2121 abuts against the the first supporting member 22. In this way, in the folded state, the second supporting surface 2121 of the first transmission assembly 21 may support the first supporting member 22, and the first supporting surface 2111 may also support the flexible display screen to a certain extent, so as to improve stability of the entire machine in the folded state.

As shown in FIG. 6, in some examples, the first transmission assembly 21 may include a first structure portion 211 and a second structure portion 212 connected to the first structure portion 211, and the second structure portion 212 is closer to the base plate 10 than the first structure portion 211. One side, close to the first supporting member 22, of the first structure portion 211 is provided with the first supporting surface 2111, and one side, close to the first supporting member 22, of the second structure portion 212 is provided with the second supporting surface 2121. The second structure portion 212 includes a first end (an upper end shown in FIG. 6) close to one side of the first structure portion 211, and a second end (a lower end shown in FIG. 6) away from the first structure portion 211. In a direction from the first end to the second end, a thickness of the second structure portion 212 in a direction (a dotted line direction shown in FIG. 6) perpendicular to the first supporting surface 2111 gradually decreases, such that a second preset included angle is formed between the second supporting surface 2121 and the first supporting surface 2111.

In some examples, at least two rotary shaft assemblies 20 are arranged, and at least one rotary shaft assembly 20 is arranged on each of two opposite sides of the base plate 10 in a first direction (a Y direction shown in the figure). In the example, the first direction may be perpendicular to the first axial direction. In other examples, the first direction may be other directions, which is not limited in the disclosure. In an illustrated example, the situation that two rotary shaft assemblies 20 are arranged, and one rotary shaft assembly 20 is arranged on each of two sides of the base plate 10 is taken as an example. Certainly, it should be noted that the number of the rotary shaft assemblies 20 and the number of the rotary shaft assembly 20 arranged on the same side of the base plate 10 may be adjusted according to actual situations, such as a length, an assembly space and a placement position of the foldable electronic device, which is not limited in the disclosure.

In some examples, at least one of the first transmission assembly 21 and the second transmission assembly 23 of the rotary shaft assembly 20 positioned on one side of the base plate 10 is provided with a first meshing member 31, and at least one of the first transmission assembly 21 and the second transmission assembly 23 of the rotary shaft assembly 20 positioned on another side of the base plate 10 is provided with a second meshing member 32 meshing with the first meshing member 31. The first meshing member 31 positioned on one side of the base plate 10 is connected, in a meshing manner, to the second meshing member 32 positioned on the other side of the base plate 10, such that the rotary shaft assemblies 20 positioned on the two sides of the base plate 10 keep synchronously moving. In some examples, the first meshing member 31 and the second meshing member 32 may be gears adapting to each other, or may be other meshing members adapting to each other, which is not limited in the disclosure. It can be understood that, in the rotary shaft assembly 20 positioned on one side of the base plate 10, the first transmission assembly 21 may be provided with the first meshing member 31, the second transmission assembly 23 may be provided with the first meshing member 31, or both the first transmission assembly 21 and the second transmission assembly 23 may be provided with the first meshing members 31. In the rotary shaft assembly 20 positioned on the other side of the base plate 10, the first transmission assembly 21 may be provided with the second meshing member 32, the second transmission assembly 23 may be provided with the second meshing member 32, or both the first transmission assembly 21 and the second transmission assembly 23 may be provided with the second meshing members 32. Positions of the first meshing member 31 and the second meshing member 32 may be adjusted according to actual requirements, which is not limited in the disclosure.

In this way, the rotary shaft assembly 20 positioned on one side of the base plate 10 may be connected to one of the first housing and the second housing of the middle frame housing 91, and the rotary shaft assembly 20 positioned at the other side of the base plate 10 may be connected to the other one of the first housing and the second housing. When a user rotates any one of the first housing and the second housing, through meshing between the first meshing member 31 and the second meshing member 32 on the two sides of the base plate 10, the other one of the first housing and the second housing may be driven to synchronously rotate, so as to realize synchronous folding or unfolding from two sides, driving the flexible display screen 92 to be synchronously bent or unfolded.

Figure 4:
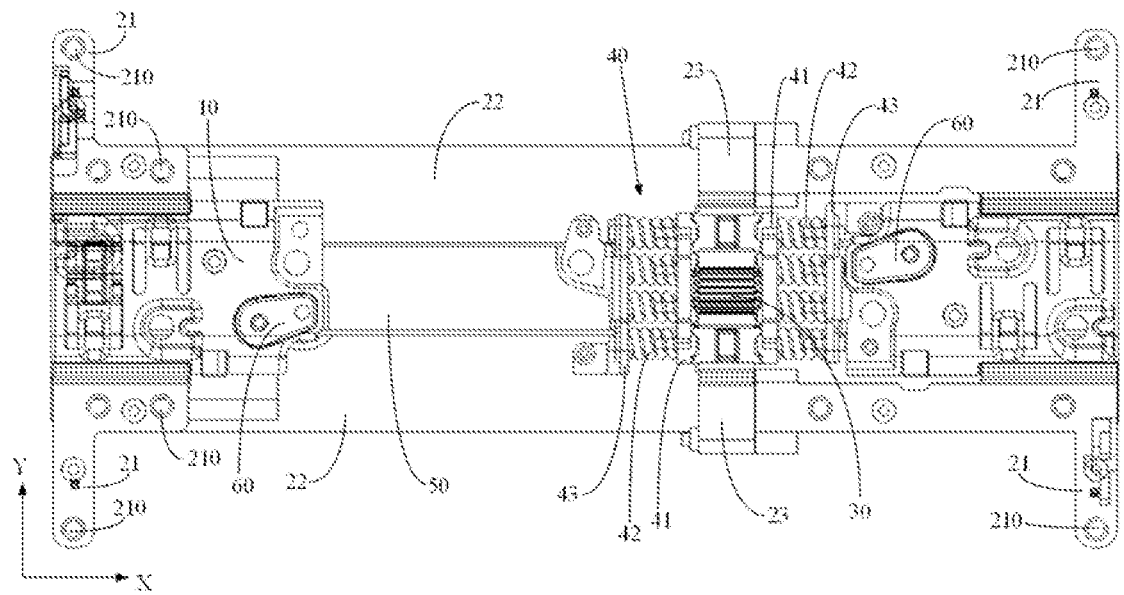
FIG. 4 is a schematic rear view of a rotary shaft apparatus illustrated according to an example.
Figure 10:
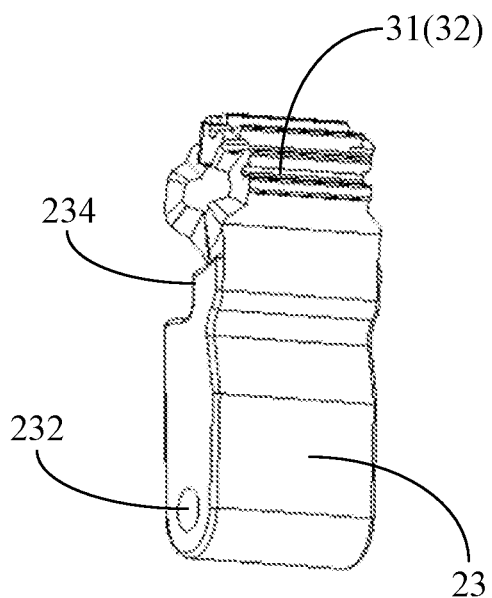
FIG. 10 is a schematic structural diagram of a second transmission assembly illustrated according to an example.

As shown in FIG. 4 and FIG. 10, in an illustrated example, the second transmission assembly 23 of the rotary shaft assembly 20 positioned on one side of the base plate 10 is provided with a first meshing member 31, and the second transmission assembly 23 of the rotary shaft assembly 20 positioned on the other side of the base plate 10 is provided with a second meshing member 32. In an illustrated example, the first meshing member 31 and the second transmission assembly 23 are integrally arranged. It should be noted that, the first meshing member 31, the second meshing member 32, and the first transmission assembly 21 and the second transmission assembly 23 of the rotary shaft assembly 20 may be integrally arranged, or may be detachably connected to each other in an assembly manner, which may be determined according to actual requirements and is not limited in the disclosure.

In some examples, the rotary shaft apparatus 200 may further include at least one linkage transmission pair 30 connected, in a meshing manner, between the first meshing member 31 and the corresponding second meshing member 32 that are positioned on the two sides of the base plate 10. By arranging the linkage transmission pair 30 between the first meshing member 31 and the second meshing member 32, stability of synchronous rotation may be improved. When a user rotates any one of the first housing and the second housing, through meshing between the first meshing member 31 and the second meshing member 32 on the two sides of the base plate 10 and the linkage transmission pair 30, the other one of the first housing and the second housing may be driven to synchronously rotate, so as to realize synchronous folding or unfolding from two sides, driving the flexible display screen 92 to be synchronously bent or unfolded. It can be understood that one or more linkage transmission pairs 30 may be arranged, which may be determined according to actual requirements and is not limited in the disclosure. In an illustrated example, the situation that one linkage transmission pair 30 is arranged is taken as an example.

In some examples, the first meshing member 31 and the second meshing member 32 may be gears adapting to each other, and the linkage transmission pair 30 may be a linkage gear pair, and may include two or more synchronous gears 33 that mesh with each other. The first meshing member 31 meshes with one of the synchronous gears 33, the second meshing member 32 meshes with another synchronous gear 33, and the first meshing member 31, the second meshing member 32 and the synchronous gears 33 match each other to realize synchronous transmission. It should be noted that the first meshing member 31, the second meshing member 32 and the linkage transmission pair 30 may be other meshing members that match each other, and the number of the linkage transmission pair 30 may be set according to actual requirements, which is not limited in the disclosure.

In this way, the first transmission assembly 21 of the rotary shaft assembly 20 positioned on one side of the base plate rotates relative to the base plate 10, so as to drive the first supporting member 22 of the same rotary shaft assembly to rotate. The second transmission assembly 23 of the same rotary shaft assembly is driven to rotate relative to the base plate 10 by the first supporting member 22, and then through meshing between the first meshing member 31, the linkage transmission pair 30 and the second meshing member 32, the second transmission assembly 23 of the rotary shaft assembly 20 on the other side of the base plate 10 is driven to synchronously rotate relative to the base plate 10. Then, the first supporting member 22 of the rotary shaft assembly 20 on the other side is driven to synchronously rotate by the second transmission assembly 23, and the first transmission assembly 21 of the rotary shaft assembly 20 on the other side is driven to rotate relative to the base plate 10 by the first supporting member 22, so as to drive the rotary shaft assembly 20 on the other side to synchronously rotate. Thus, when a user rotates any one of the first housing and the second housing, the other one of the first housing and the second housing may be driven to synchronously rotate by means of the rotary shaft apparatus 200, so as to realize synchronous folding or unfolding from two sides, driving the flexible display screen 92 to be synchronously bent or unfolded. It should be noted that the linkage transmission pair 30 may be connected between the first transmission assemblies 21 of the two rotary shaft assemblies 20, the first meshing member 31 is connected to the first transmission assembly 21 of one rotary shaft assembly 20, and the second meshing member 32 is connected to the first transmission assembly 21 of the rotary shaft assembly 20 on the other side, which is not limited in the disclosure.

As shown in FIG. 4, in some examples, the rotary shaft apparatus 200 may further include a damper 40 abutting against at least one of the first transmission assembly 21 and the second transmission assembly 23 of the rotary shaft assembly 20. In this way, the damper 40 may provide a certain frictional damping for the rotary shaft assembly 20, and the rotary shaft assemblies 20 on the two sides of the base plate 10 may have a better hovering effect when rotating synchronously, so as to improve hand feeling experience of a user rotating the foldable electronic device 100. It should be noted that when the linkage transmission pair 30 is provided, the damper 40 may abut against the first meshing member 31, the second meshing member 32 and the linkage transmission pair 30. In some examples, the base plate 10 may be provided with an assembly space, such as a recess, for accommodating and assembling the damper 40, which is not limited in the disclosure.

In some examples, the damper 40 includes a clamping plate 41 and a first elastic member 42, and the clamping plate 41 abuts against at least one of the first transmission assembly 21 and the second transmission assembly 23 in a second direction. One end of the first elastic member 42 abuts against the clamping plate 41, and the other end of the first elastic member abuts against the base plate 10. In this way, an elastic force is provided for the clamping plate 41 by the first elastic member 42, and the clamping plate 41 abuts against at least one of the first transmission assembly 21 and the second transmission assembly 23 to provide frictional damping for same. In an illustrated example, the second direction is parallel to the first axial direction, which is an X direction shown in the figure. In other examples, the second direction may be other directions, which is not limited in the disclosure.

It should be noted that, under the situation that the linkage transmission pair 30 is arranged, the clamping plate 41 may abut against the first meshing member 31, the second meshing member 32 and the linkage transmission pair 30. In some examples, the damper 40 may further include a fixed plate 43 fixedly connected to the base plate 10 by means of a screw, a bolt or other fastening manners. One end of the first elastic member 42 abuts against the clamping plate 41, and the other end of the first elastic member abuts against the fixed plate 43, so as to improve stability of the first elastic member 42. In some examples, the clamping plate 41, the first elastic member 42 and the fixed plate 43 may be arranged in the recess, and the fixed plate 43 may be fixedly connected to an inner wall of the recess by means of a screw, a bolt or other fastening manners.

In an illustrated example, the first elastic member 42 may be a spring. Two clamping plates 41 may be arranged and abut against two sides of at least one of the first transmission assembly 21 and the second transmission assembly 23 of the rotary shaft assembly 20 in the second direction respectively, so as to generate frictional damping on two sides of the rotary shaft assembly 20, achieving a better hovering effect when the rotary shaft assembly 20 rotates, and further improving hand feeling experience of a user rotating the foldable electronic device 100. It should be noted that the first elastic member 42 may be other elastic structures, and the other number of the clamping plates 41 may be arranged as required, which is not limited in the disclosure.

In some examples, at least one of the first transmission assembly 21 and the second transmission assembly 23 of the rotary shaft assembly 20 is provided with a first connection hole penetrating in the second direction, the clamping plate 41 is provided with a second connection hole penetrating in the second direction, and the second connection hole corresponds to the first connection hole. At least one of the first transmission assembly 21 and the second transmission assembly 23 is provided with a first cam structure 2301, the clamping plate 41 is provided with a second cam structure 4101 adapting to the first cam structure 2301, and the second cam structure 4101 abuts against the first cam structure 2301. It can be understood that the clamping plate 41 may be a cam plate or other plate provided with a cam structure. The damper 40 may further include a connection shaft 44 in the second direction, the connection shaft 44 penetrates the first connection hole and the second connection hole, and the first elastic member 42 sleeves the connection shaft 44. In this way, through cam matching between the first cam structure 2301 and the second cam structure 4101, when the rotary shaft assemblies 20 on the two sides synchronously rotate, the first elastic member 42 may be pressed to generate greater frictional damping, so as to achieve a better hovering effect, and further improve hand feeling experience of a user rotating the foldable electronic device 100. In an illustrated example, both the first meshing member 31 and the second meshing member 32 are arranged on the second transmission assembly 23. The first connection hole may be provided in the first meshing member 31 and the second meshing member 32. In this way, the connection shaft 44 penetrates the corresponding first connection hole and second connection hole to connect the second transmission assembly 23 and the clamping plate 41 into a whole, and the second transmission assembly 23 may rotate relative to the base plate 10 by taking the connection shaft 44 as an axis. It should be noted that, under the situation that the linkage transmission pair 30 is arranged, the synchronous gears 33 of the linkage transmission pair 30 and the clamping plate 41 may further be provided with connection holes at corresponding positions, and the connection shaft 44 penetrates the corresponding connection holes to connect the clamping plate 41 and the linkage transmission pair 30 into a whole.

As shown in FIGS. 6 and 8-11, in some examples, one of the first supporting member 22 and the second transmission assembly 23 is provided with a second track shaft 231 parallel to the third axial direction, and the other one of the first supporting member 22 and the second transmission assembly 23 is provided with a second track structure 224 in sliding fit with the second track shaft 231. The second track structure 224 may be provided with a sliding groove structure matching the second track shaft 231, such as a second cambered track groove 225 shown in the figure. When the first transmission assembly 21 rotates relative to the base plate 10, the second track shaft 231 slides along the second cambered track groove 225 relative to the second track structure 224, and portions, in contact with each other, of the second track structure 224 and the second track shaft 231 drive the second track shaft 231 to rotate, so as to drive the second transmission assembly 23 to rotate relative to the base plate 10. In an illustrated example, the second track structure 224 may include the second cambered track groove 225. In other examples, the second track structure 224 may include a sliding groove structure in other shapes, which is not limited in the disclosure. In other examples, the second transmission assembly 23 may be movably connected to the first transmission assembly 21. The transmission assembly 21 drives, when rotating relative to the base plate 10, the first supporting member 22 to rotate, and the first transmission assembly 21 drives the second transmission assembly 23 to rotate relative to the base plate 10, which is not limited in the disclosure.

Figure 11:
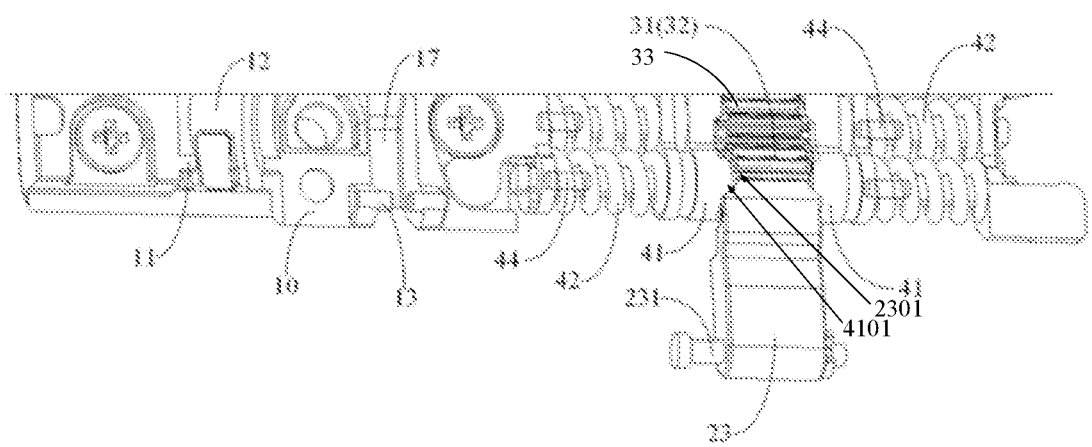
FIG. 11 is a schematic assembly diagram of a first transmission assembly and a second transmission assembly illustrated according to an example.

Further, as shown in FIGS. 10 and 11, one end, away from the base plate 10, of the second transmission assembly 23 may be provided with a shaft hole 232, and the second track shaft 231 is arranged in the shaft hole 232. In an example shown in FIG. 6, one end, away from the base plate 10, of the second transmission assembly 23 may be provided with a shaft groove 233, and the second track shaft 231 is arranged in the shaft groove 233. In some examples, both two sides of the second track structure 224 in a length direction of the first supporting member 22 may be provided with second cambered track grooves 225. Both two sides of the shaft groove 233 in a length direction of the base plate 10 may be provided with second track shafts 231 that match the second cambered track grooves 225 in a one-to-one correspondence manner, so as to improve stability of the first supporting member 22 during movement.

It can be understood that the first transmission assembly 21 rotates relative to the base plate around the first axial direction, and the second transmission assembly 23 rotates relative to the base plate 10 around the third axial direction, that is, the first transmission assembly and the second transmission assembly rotate relative to the base plate 10 around two different axial directions respectively. Through matching between the second track shaft 231 and the second cambered track groove 225, the first transmission assembly 21 rotates relative to the base plate 10 around the first axial direction to drive the first supporting member 22 to rotate. As the second track shaft 231 slides along the second cambered track groove 225 relative to the second track structure 224, contact positions of the first supporting member 22 and the second track shaft 231 may be adjusted in real time, such that no matter where the first supporting member 22 rotates to, the second transmission assembly 23 may be driven to rotate relative to the base plate 10 around a third axial direction different from the first axial direction.

As shown in FIGS. 3 and 5, in some examples, the rotary shaft apparatus 200 may further include a second supporting member 50 capable of being movably arranged on the base plate 10 in a third direction (a Z direction shown in the figure), and may also be interactively connected to that base plate 10 in other directions, which is not limited in the disclosure. The base plate 10 includes a first supporting plane 1001, the first supporting member 22 includes a second supporting plane 2201, and the second supporting member 50 includes a third supporting plane 5001 (an upper surface shown in FIG. 5).

Figure 12:
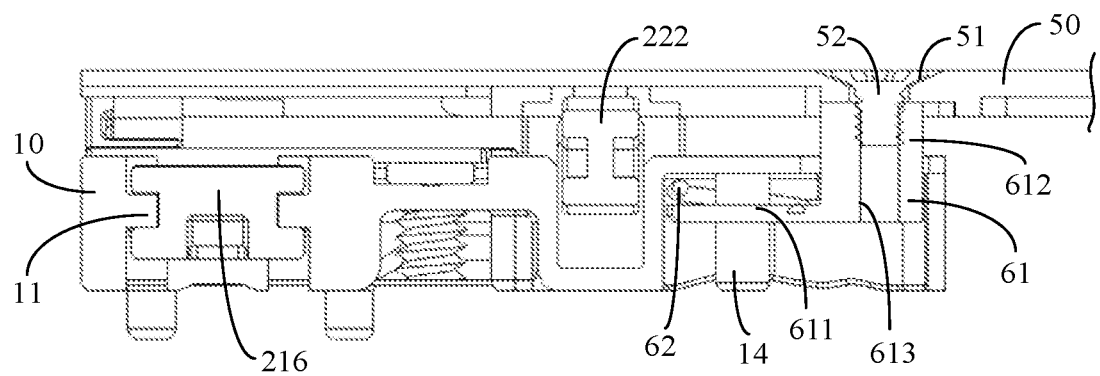
FIGS. 12 and 13 are side views of a rotary shaft apparatus in different states illustrated according to an example.

As shown in FIGS. 3, 5 and 12, when the rotary shaft apparatus 200 is in an unfolded state, the second supporting member 50 is positioned at a first position, the third supporting plane 5001 and the second supporting plane 2201 of the first supporting member 22 are positioned on the same plane, and the first supporting member 22 and the second supporting member 50 may be used for supporting the flexible display screen 92.

Figure 13:
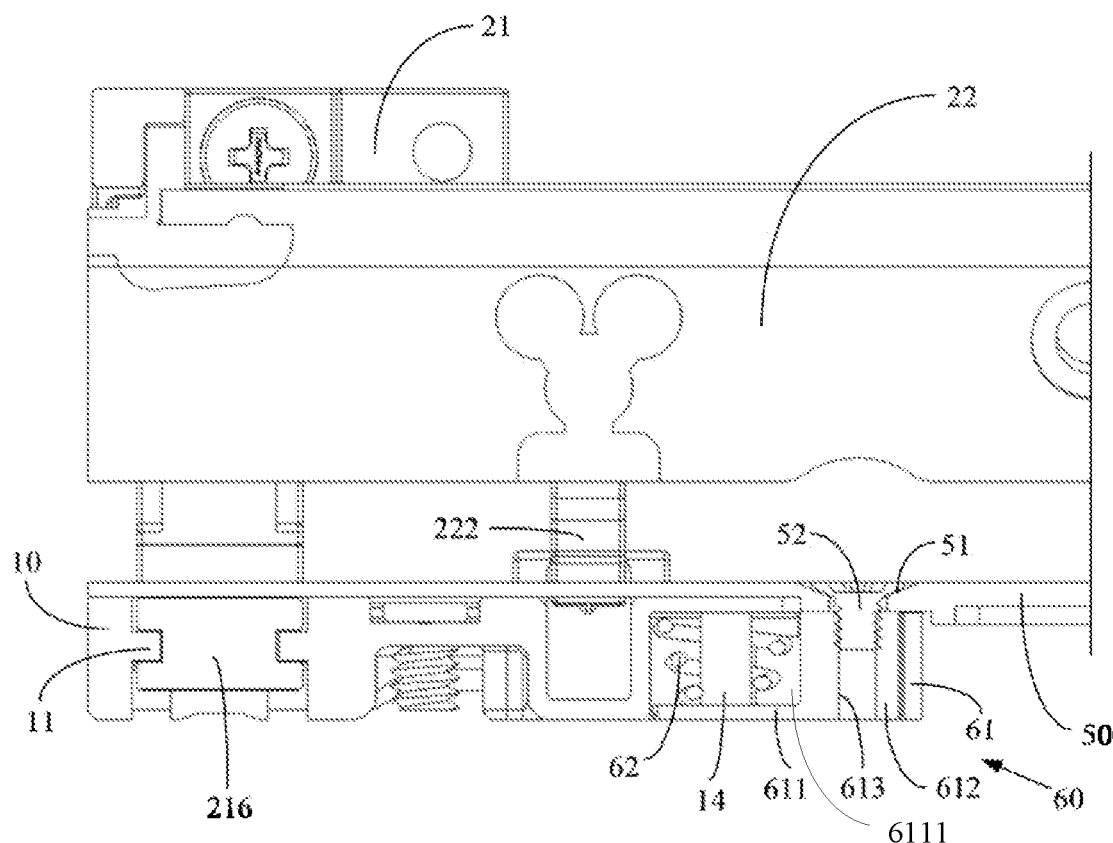

As shown in FIGS. 6 and 13, when the rotary shaft apparatus 200 is in a folded state, a first preset included angle is formed between the first supporting member 22 and the first supporting plane 1001 of the base plate 10. The third plane of the second supporting member 50 is positioned at a second position, the second position is closer to the base plate 10 than the first position, and the first supporting member 22 and the second supporting member 50 define a screen-accommodating space. In some examples, the first preset included angle may range from 60 degrees to 75 degrees, and may be adjusted according to actual situations, which is not limited in the disclosure. In this way, when the rotary shaft apparatus 200 is switched from the unfolded state to the folded state, the second supporting member 50 may move from the first position to the second position closer to the base plate 10 in the third direction, so as to make more space for the "drop-shaped" screen-accommodating space and further enlarge the screen-accommodating space.

Figure 14:
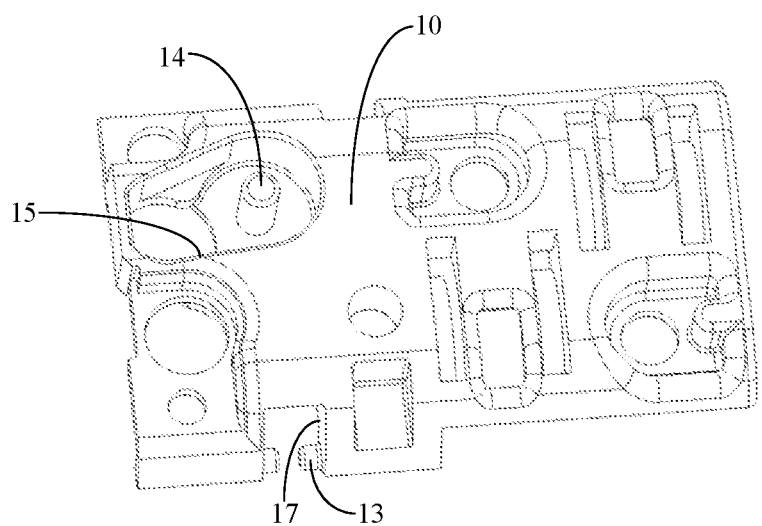
FIG. 14 is a schematic partial view of a base plate illustrated according to an example.

As shown in FIGS. 12-14, in some examples, the rotary shaft apparatus 200 may further include a third transmission assembly 60 arranged on the base plate 10, connected to the second supporting member 50, and used for driving the second supporting member 50 to move in the third direction. In some examples, two or more third transmission assemblies 60 may be arranged in a length direction (an X direction shown in the figure) of the second supporting member 50 at intervals, so as to improve stability of the second supporting member 50 during movement.

The third transmission assembly 60 may include a transmission member 61 and a second elastic member 62 connected to the transmission member 61. One side of the transmission member 61 is connected to one side, close to the base plate 10, of the second supporting member 50, and the other side of the transmission member is movably connected to the base plate 10. One end of the second elastic member 62 is connected to the base plate 10, and the other end of the second elastic member is connected to the transmission member 61. In some examples, the second elastic member 62 may be a spring. In this way, the second supporting member 50 is driven to move in the third direction by an elastic force provided by the second elastic member 62.

Figure 8:
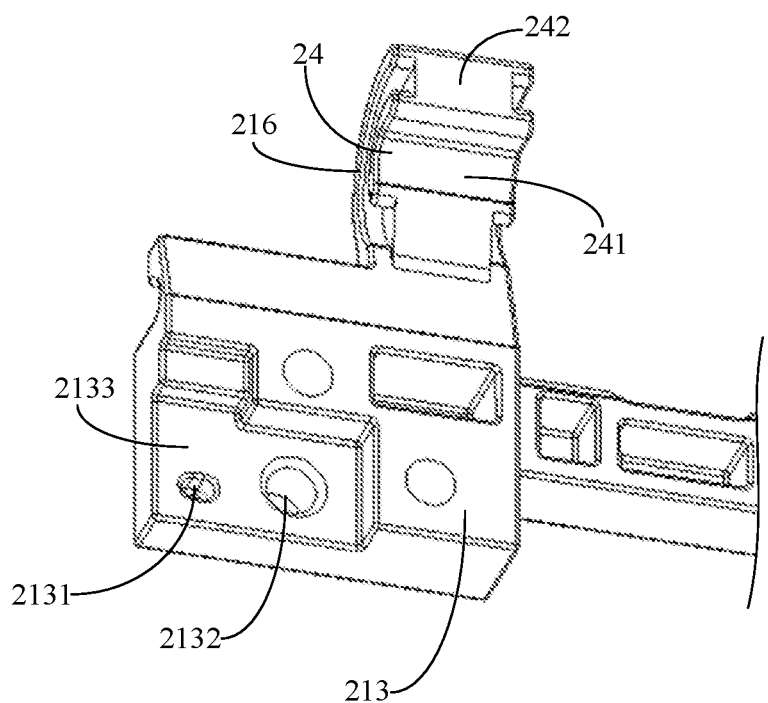
FIGS. 8 and 9 are schematic structural diagrams of a main body of a first transmission assembly illustrated according to an example.

As shown in FIG. 8, in some examples, an end portion or other position of the first transmission assembly 21 may be provided with an abutting and pushing portion 24, and the abutting and pushing portion 24 may be positioned between the base plate 10 and the second supporting member 50. When the rotary shaft apparatus 200 is switched from the folded state to the unfolded state, the abutting and pushing portion 24 is used for driving the second supporting member 50 to move from the second position to the first position. In the unfolded state, the abutting and pushing portion 24 supports one side, close to the base plate 10, of the second supporting member 50, so as to improve stability of the second supporting member 50 in the unfolded state.

It can be understood that, when the first transmission assembly 21 rotates from the folded state shown in FIG. 6 to the unfolded state shown in FIG. 5, the second supporting member 50 is driven to rise from the second position shown in FIG. 13 to the first position shown in FIG. 12 in the third direction by the abutting and pushing portion 24. In the unfolded state shown in FIG. 5, the abutting and pushing portion 24 supports the side, close to the base plate 10, of the second supporting member 50.

When the first transmission assembly 21 rotates from the unfolded state shown in FIG. 5 to the folded state shown in FIG. 6, under the action of weight of the second supporting member and elasticity of the second elastic member 62, the second supporting member 50 gradually descends from the first position shown in FIG. 12 to the second position shown in FIG. 13 in the third direction.

In some examples, a side portion of the abutting and pushing portion 24 is provided with a cambered surface 241, and an end portion of the abutting and pushing portion 24 is provided with an abutting and pushing surface 242 connected to the cambered surface. When the rotary shaft apparatus 200 is in the folded state, a side portion of the second supporting member 50 abuts against the cambered surface 241. When the rotary shaft apparatus 200 is switched from the folded state to the unfolded state, the abutting and pushing surface 242 drives the second supporting member 50 to move from the second position to the first position. When the rotary shaft apparatus 200 is in the unfolded state, the abutting and pushing surface 242 supports the side, close to the base plate 10, of the second supporting member 50, so as to improve stability of the second supporting member 50 in the unfolded state.

As shown in FIGS. 12-14, in some examples, the transmission member 61 includes a transmission portion 611 and a connection portion 612. One end of the connection portion 612 is connected to one side (a bottom side shown in the figures), close to the base plate 10, of the second supporting member 50, and the other end of the connection portion is connected to the transmission portion 611. The transmission portion 611 is movably connected to the base plate 10 in the third direction. One end of the second elastic member 62 is connected to the base plate 10, and the other end of the second elastic member is connected to the transmission member 61. In some examples, the second supporting member 50 may be provided with a first screw hole 51, and the connection portion 612 may be provided with a corresponding second screw hole 613. A fastener 52 such as a screw penetrates the first screw hole 51 to be fixed to the second screw hole 613, so as to fixedly connect the connection portion 612 to the second supporting member 50. In this way, when the second supporting member 50 moves relative to the base plate 10 in the third direction, the connection portion 612 and the transmission portion 611 are driven to synchronously move, so as to press or stretch the second elastic member 62 such that the second elastic member 62 may provide a certain elastic force for the second supporting member 50.

Further, the transmission portion 611 is provided with a third guide portion 6111, and one side, close to the second supporting member 50, of the base plate 10 is provided with a fourth guide portion 14 in guide fit with the third guide portion 6111. In an illustrated example, the third guide portion 6111 may include a guide hole provided in the third direction, the fourth guide portion 14 may include a guide column, and the guide column penetrates the third guide portion 6111. In other examples, the third guide portion 6111 and the fourth guide portion may be in other structural forms, as long as a guide function may be realized, which is not limited in the disclosure.

The second elastic member 62 sleeves the fourth guide portion 14. One end of the second elastic member 62 is connected to the fourth guide portion 14, and the other end of the second elastic member is connected to the transmission portion 611. In an illustrated example, one end of the second elastic member 62 is connected to one end, close to the second supporting member 50, of the fourth guide portion 14, and the other end of the second elastic member is connected to one side, close to the second supporting member 50, of the transmission portion 611. In other examples, a connection position of the second elastic member 62 may be set according to situations, which is not limited in the disclosure. In some examples, as shown in FIG. 14, the base plate 10 may be provided with a structural groove 15 adapting to the structure of the transmission member 61, and the fourth guide portion 14 may be a guide column arranged in the structural groove 15. The transmission member 61 is arranged in the structural groove 15, the transmission portion 611 is positioned below the second elastic member 62, an upper end of the second elastic member 62 is connected to the fourth guide portion 14, and a lower end of the second elastic member is connected to the transmission portion 611.

In this way, the first transmission assembly 21 drives, when rotating from the folded state shown in FIG. 6 to the unfolded state shown in FIG. 5, the second supporting member 50 to move from the second position shown in FIG. 13 to the first position shown in FIG. 12, the second supporting member 50 drives, when moving, the connection portion 612 and the transmission portion 611 to synchronously move, the transmission portion 611 presses the second elastic member 62 such that the second elastic member 62 is in a compressed state, and the second elastic member 62 exerts a downward elastic force on the transmission portion 611.

When the first transmission assembly 21 rotates from the unfolded state shown in FIG. 5 to the folded state shown in FIG. 6, under the action of weight of the second supporting member 50 and elasticity of the second elastic member 62 on the transmission portion 611, the second supporting member gradually descends from the first position shown in FIG. 12 to the second position shown in FIG. 13.

As shown in FIGS. 6, 8, 9 and 15, in some examples, the first transmission assembly 21 includes a main body 213 and a fixing member 214 detachably connected to the main body 213, the main body 213 is rotatably connected to the base plate 10 around the first axial direction, and the first supporting member 22 is rotatably connected to at least one of the main body 213 and the fixing member 214 around the second axial direction. In this way, the first transmission assembly 21 is set as two detachable parts which may be assembled to each other. After the first supporting member 22 is assembled to one of the main body 213 and the fixing member 214, the main body 213 is assembled to the fixing member 214, such that the first supporting member 22 is assembled to the first transmission assembly 21, which is conducive to assembly and disassembly of the first supporting member 22 and the first transmission assembly 21. In the example, the situation that the first supporting member 22 is assembled to the fixing member 214 first and then the first supporting member, the fixing member is assembled to the main body 213 is taken as an example for illustration. When the first supporting member 22 is assembled to the first transmission assembly 21, the first transmission assembly 21 may be rotated to the main body 213 to be unfolded, then the first supporting member 22 is unfolded to be aligned with the main body 213, and the fixing member 214 is to the main body 213 such that the first supporting member 22 may be conveniently assembled to the first transmission assembly 21. Thus, additional assembly parts may be omitted, the number of components may be reduced, clearances may be reduced, assembly precision may be improved, and synchronization may be improved.

Figure 15:
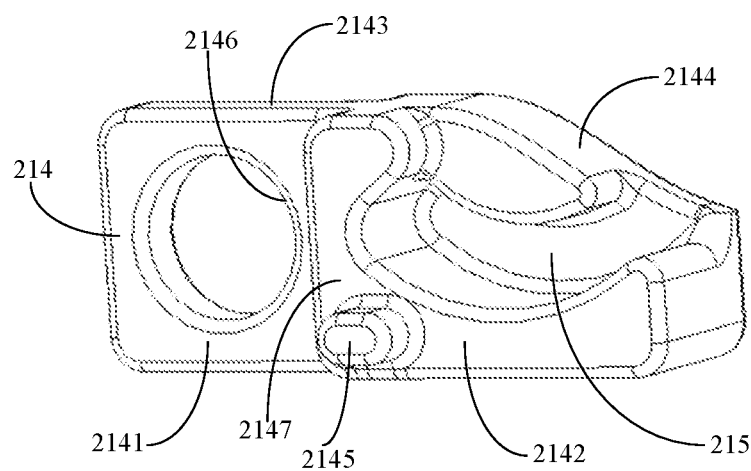
FIG. 15 is a schematic structural diagram of a fixing member of a first transmission assembly illustrated according to an example.

It should be noted that, as shown in FIGS. 6 and 15, in some examples, the main body 213 may include the first structure portion 211 and the second structure portion 212. The fixing member 214 may include a first fixing sub-member 2141 and a second fixing sub-member 2142 connected to the first fixing sub-member 2141, and the second fixing sub-member 2142 is closer to the base plate 10 than the first fixing sub-member 2141. One side, close to the first supporting member 22, of the first fixing sub-member 2141 is provided with a third supporting surface 2143 flush with the first supporting surface 2111, one side, close to the first supporting member 22, of the second fixing sub-member 2142 is provided with a fourth supporting surface 2144 flush with the second supporting surface 2121, and the second preset included angle is also formed between the fourth supporting surface 2144 and the third supporting surface 2143. In this way, the first supporting surface 2111 of the main body 213 and the third supporting surface 2143 of the fixing member 214 together form a supporting surface for supporting the flexible display screen, and the second supporting surface 2121 of the main body 213 and the fourth supporting surface 2144 of the fixing member 214 together form a supporting surface for supporting the first supporting member 22.

Figure 16:
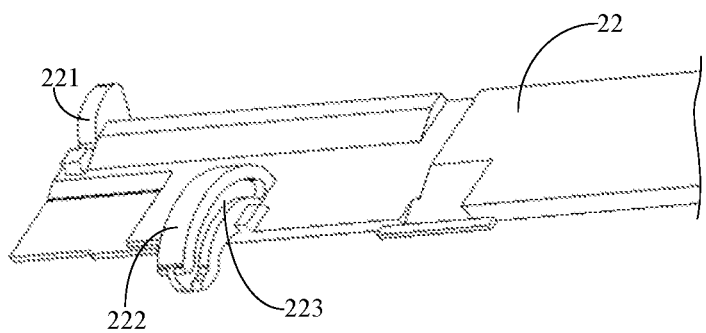
FIG. 16 is a schematic structural diagram of a first supporting member illustrated according to an example.

Further, as shown in FIGS. 15 and 16, at least one of the main body 213 and the fixing member 214 may be provided with a first guide portion, and the first supporting member 22 may be provided with a second guide portion in sliding fit with the first guide portion. Alternatively, a first guide portion is jointly formed between the main body 213 and the fixing member 214, and the first supporting member 22 is provided with a second guide portion in sliding fit with the first guide portion. It can be understood that the first guide portion may be arranged on the main body 213, or on the fixing member 214, or may be formed by part of the main body 213 and part of the fixing member 214. For example, in some examples, the first guide portion may be arranged on a side wall, close to the main body 213, of the fixing member 214. When the first transmission assembly 21 rotates relative to the base plate 10, through sliding fit between the first guide portion and the second guide portion, the first supporting member 22 is driven to rotate. In some examples, the first guide portion includes at least one of a sliding groove and a sliding member, and the second guide portion includes at least one of a sliding groove and a sliding member that match the first guide portion. The structure of the sliding groove and the structure of the sliding member may be set according to actual situations, which is not limited in the disclosure.

In some examples, the first guide portion may include one of the first cambered groove 215 and the first cambered structure 221 that adapt to each other, and the second guide portion may include the other one of the first cambered groove 215 and the first cambered structure 221 that match each other. It can be understood that a side wall, close to the main body 213, of the fixing member 214 is provided with one of the first cambered groove 215 and the first cambered structure 221 that match each other, the first supporting member 22 is provided with the other one of the first cambered groove 215 and the first cambered structure 221, the first cambered structure 221 is arranged in the first cambered groove 215, and an axial direction of the first cambered groove 215 and an axial direction of the first cambered structure 221 are both set in the second axial direction. When the first transmission assembly 21 rotates relative to the base plate 10, the first cambered structure 221 slides along the first cambered groove 215, so as to drive the first supporting member 22 to rotate.

In this way, when the first transmission assembly 21 rotates relative to the base plate 10, the first supporting member 22 may be driven to rotate relative to the first transmission assembly 21 through cambered track matching between the first cambered groove 215 and the first cambered structure 221, and the cambered track matching between the first cambered groove 215 and the first cambered structure 221 has certain guiding and limiting functions, improving stability of the first supporting member 22 during rotation. In the example, a side wall, close to the main body 213, of the fixing member 214 is provided with the first cambered groove 215, and the first supporting member 22 is provided with the first cambered structure 221. It can be understood that, under the situation that one rotary shaft assembly 20 includes two first transmission assemblies 21, two ends of the first supporting member 22 in a length direction may be provided with first cambered structures 221 respectively that match the first cambered grooves 215 of the fixing members 214 of the two first transmission assemblies 21 respectively.

In some examples, an accommodating space for accommodating part of the first supporting member 22 is defined by the fixing member 214 and the main body 213. The first cambered structure 221 of the first supporting member 22 is in sliding fit with the first cambered groove 215 of the fixing member 214 in the accommodating space.

Figure 17:
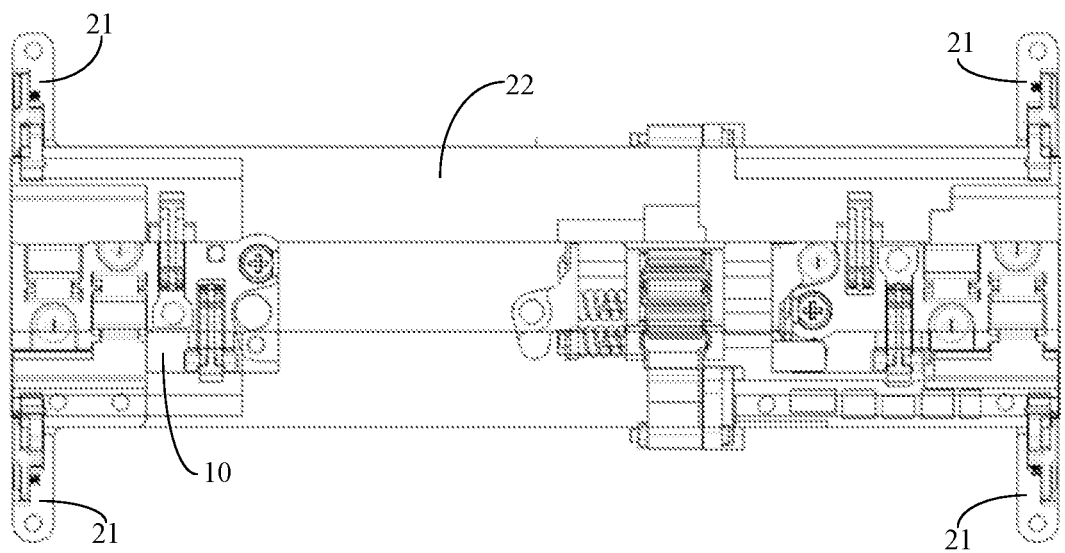
FIGS. 17-19 are schematic assembly diagrams of a first supporting member and a first transmission assembly illustrated according to an example.
Figure 18:
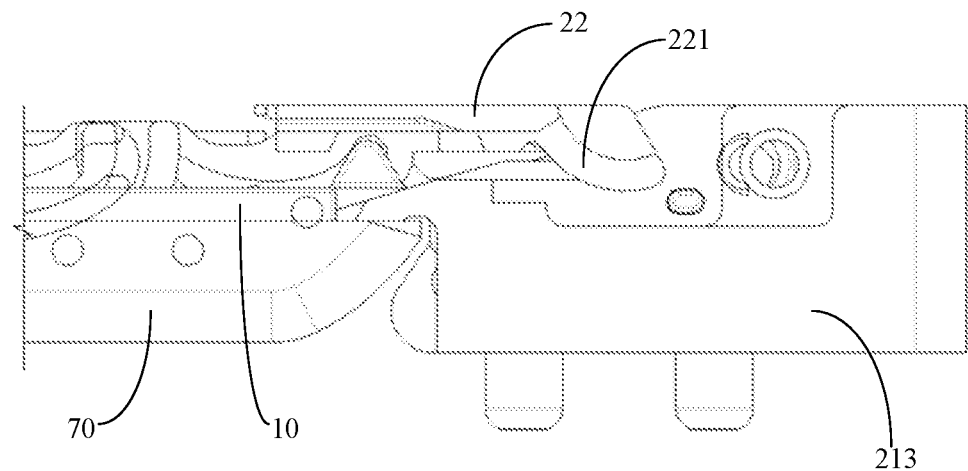
Figure 19:
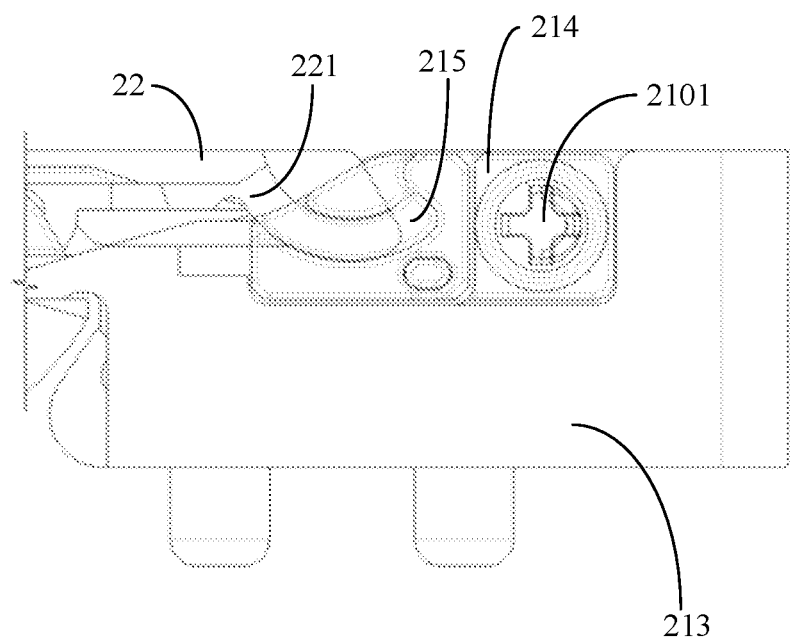

As shown in FIGS. 17-19, when the first supporting member 22 is assembled to the first transmission assembly 21, the first transmission assembly 21 may be rotated to the main body 213 to be unfolded first. The first supporting member 22 is unfolded to be aligned with the main body 213, which is shown in FIGS. 17 and 18. Then, the first cambered structure 221 of the first supporting member 22 is snapped into the first cambered groove 215 of the fixing member 214, and then the whole is fixed to the main body 213, so as to complete assembly, which is shown in FIG. 19.

Figure 9:
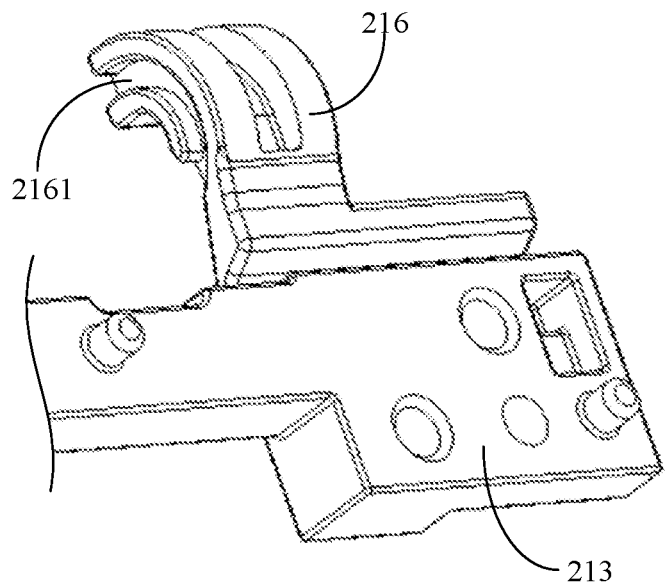

In some examples, as shown in FIGS. 8, 9 and 15, the main body 213 is provided with a first positioning portion, and the fixing member 214 is provided with a second positioning portion in positioning fit with the first positioning portion. One of the first positioning portion and the second positioning portion may be a structure such as a positioning hole, a positioning column and a positioning groove, and the other one of the first positioning portion and the second positioning portion may be a structure such as a positioning column and a positioning member that match the positioning hole, the positioning column and the positioning groove, which is not limited in the disclosure.

In some examples, in some examples, the main body 213 is provided with one of the positioning member 2145 and the positioning hole 2131 which adapt to each other, and the fixing member 214 is provided with the other one of the positioning member 2145 and the positioning hole 2131. When the fixing member 214 is connected to the main body 213, the positioning member 2145 penetrates the positioning hole 2131, so as to play a positioning role when the fixing member 214 is assembled and fixed to the main body 213, improving assembly accuracy of the fixing member 214 and the main body 213. In the example, the main body 213 is provided with a positioning hole 2131, and the fixing member 214 is provided with a positioning member 2145. The positioning hole 2131 is a racetrack-shaped hole, and the positioning member 2145 is of a racetrack-shaped structure. The positioning hole 2131 and the positioning member 2145 may be in other shapes according to actual situations, which is not limited in the disclosure.

In some examples, the main body 213 is provided with a first connection portion 2132, and the fixing member 214 is provided with a second connection portion 2146 that is connected to and matches the first connection portion 2132. One of the first connection portion 2132 and the second connection portion 2146 may be a structure such as a connection hole, a screw hole, an unthreaded hole, a rivet hole and a connection groove, and the other one of the first connection portion 2132 and the second connection portion 2146 may be a structure such as a connection column, a connection member, a screw, a bolt and a rivet that matches the connection hole, the screw hole, the unthreaded hole, the rivet hole and the connection groove, which is not limited in the disclosure.

As shown in FIGS. 6 and 19, fastener 2101 is used to connect the first connection portion 2132 and the second connection portion 2146, and the fastener 2101 may be a structure such as a screw, a bolt, a rivet or the like.

In some examples, one side, close to the fixing member 214, of the main body 213 is provided with a mounting groove 2133. The mounting groove 2133 matches the fixing member 214, and the fixing member 214 is arranged in the mounting groove 2133, so as to be assembled and fixed to the main body 213. The mounting groove 2133 may be used for positioning and mounting the fixing member 214 during assembly, so as to improve assembly accuracy of the fixing member 214 and the main body 213.

Further, a bottom surface of the mounting groove 2133 may be recessed inwards to form a positioning groove, one side, close to the main body, of the fixing member 214 protrudes outwards to form a protruding portion 2147, and the protruding portion 2147 is snapped in the positioning groove. Through snap fit between the positioning groove and the protruding portion 2147, the fixing member 214 may be further positioned, mounted and limited during assembly, assembly accuracy of the fixing member 214 and the main body 213 may be improved, and stability after the fixing member 214 is assembled and fixed to the main body 213 may be improved.

As shown in FIGS. 11 and 13, in some examples, the base plate 10 is provided with a first rotary shaft 11 arranged in the first axial direction, and the first transmission assembly 21 is rotatably connected to the first rotary shaft 11, so as to be rotatably connected to the base plate 10 around the first axial direction.

Further, as shown in FIGS. 6, 8, 9 and 20, a surface of one side, close to the first transmission assembly 21, of the base plate 10 is provided with a first accommodating groove 12, the first accommodating groove 12 is a cambered groove, a bottom surface of the first accommodating groove 12 is a cambered bottom surface, and the first rotary shaft 11 is formed on a side wall of the first accommodating groove 12. An end portion of one side, close to the base plate 10, of the first transmission assembly 21 is provided with a second cambered structure 216, and an outer cambered surface of the second cambered structure 216 adapts to the cambered bottom surface of the first accommodating groove 12. In some examples, the second cambered structure 216 may be provided with an abutting and pushing portion 24, an inner cambered surface of the second cambered structure 216 may be used as a cambered surface 241 of the abutting and pushing portion 24, and an end portion of the second cambered structure 216 may be provided with an abutting and pushing surface 242.

A side portion of the second cambered structure 216 in the first axial direction is provided with a guide groove 2161. The guide groove 2161 is a cambered groove, and has the same curvature as the outer cambered surface of the second cambered structure 216. The second cambered structure 216 is slidably arranged in the first accommodating groove 12, and the first rotary shaft 11 is arranged in the guide groove 2161. When the first transmission assembly 21 rotates relative to the base plate 10, the second cambered structure 216 slides along the cambered bottom surface of the first accommodating groove 12, and the first rotary shaft 11 slides along the guide groove 2161 relative to the second cambered structure 216, such that the first transmission assembly 21 is rotatably connected to the base plate 10 around the first axial direction. In a rotation process of the first transmission assembly 21, the guide groove 2161 may guide the first transmission assembly 21, so as to improve stability of rotation. In the example, two side walls of the first accommodating groove 12 are provided with the first rotary shafts 11, two side portions of the second cambered structure 216 in the first axial direction are provided with the guide grooves 2161, and two sides of the second cambered structure 216 match with the first rotary shafts 11 on two sides of the first accommodating groove 12 by means of the guide grooves 2161, so as to further improve stability when the first transmission assembly 21 rotates relative to the base plate 10.

In some examples, the rotary shaft apparatus 200 may further include a rotary shaft cover 70 covering one side, away from the first supporting plane 1001 of the base plate 10, of the base plate 10, so as to improve overall structural strength of the rotary shaft apparatus 200. In some examples, the rotary shaft cover 70 may be fixedly connected to the base plate 10 by a fastener such as a screw, a bolt and a rivet. The first transmission assembly 21 is provided with a first limiting structure 217, and at least one of the base plate 10 and the rotary shaft cover 70 is provided with a second limiting structure 16 in limiting fit with the first limiting structure 217. When the first transmission assembly 21 rotates, through limiting fit between the first limiting structure 217 and the second limiting structure 16, the first transmission assembly 21 may be limited, and the first transmission assembly 21 is prevented from slipping off the base plate 10, so as to improve stability of the rotary shaft apparatus 200 during rotation. It can be understood that the second limiting structure 16 may be arranged on the base plate 10 or on the rotary shaft cover 70, which is not limited in the disclosure.

In some examples, the first limiting structure 217 includes at least one of a limiting groove and a limiting portion, and the second limiting structure 16 includes at least one of a limiting groove and a limiting portion that adapt to the first limiting structure 217.

For example, in some examples, one side, away from the first supporting member 22, of the first transmission assembly 21 is provided with a first limiting groove, the base plate 10 is provided with a first limiting portion adapting to the first limiting groove, and the first limiting portion is arranged in the first limiting groove. When the first transmission assembly 21 rotates relative to the base plate 10, the first limiting portion slides along the first limiting groove relative to the first transmission assembly 21. In a rotation process of the first transmission assembly 21, through matching between the first limiting portion and the first limiting groove, the first transmission assembly 21 may be limited, and the first transmission assembly 21 is prevented from slipping off the base plate 10, so as to improve stability of the first transmission assembly 21 during rotation.

For example, in some other examples, one side, away from the first supporting member 22, of the first transmission assembly 21 is provided with a second limiting groove 218, and a side portion of the rotary shaft cover 70 is provided with a second limiting portion 71 adapting to the second limiting groove 218. When the first transmission assembly 21 rotates to a preset position relative to the base plate 10, the second limiting portion 71 is snapped in the second limiting groove 218. In some examples, the second limiting portion 71 may be formed at a side edge of the rotary shaft cover 70. In the example, the second limiting groove 218 may be provided in the main body 213 of the first transmission assembly 21.

The specified position may refer to a position to which the first transmission assembly 21 rotates relative to the base plate 10 to make the rotary shaft apparatus 200 in the unfolded state. Through matching between the second limiting portion 71 and the second limiting groove 218, the first transmission assembly 21 may be limited, and the first transmission assembly 21 is prevented from slipping off the base plate 10, so as to keep the first transmission assembly 21 at this position, and further improve stability of the rotary shaft apparatus 200 in the unfolded state. In some examples, as shown in FIG. 10, one side, away from the first supporting member 22, of the second transmission assembly 23 is provided with a third limiting groove 234 in limiting fit with the second limiting portion 71. When the first transmission assembly 21 rotates relative to the base plate 10 to a set position, the second limiting portion 71 is snapped into the second limiting groove 218 and the third limiting groove 234 simultaneously, so as to further improve stability of the rotary shaft apparatus 200 in the unfolded state.

Figure 20:
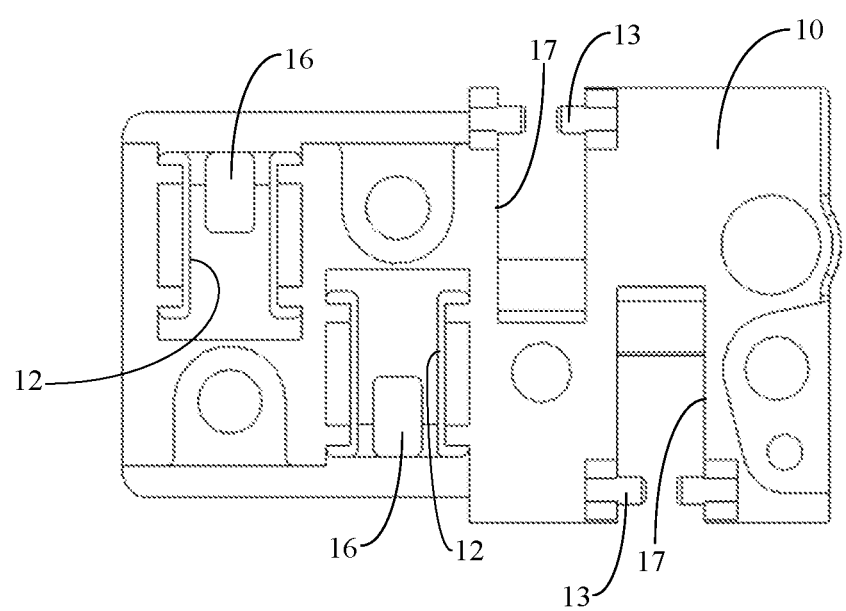
FIG. 20 is a schematic partial view of a base plate illustrated according to an example.

As shown in FIGS. 16 and 20, in some examples, the base plate 10 is provided with a first track shaft 13 parallel to the first axial direction, and the first supporting member 22 is provided with a first track groove in sliding fit with the first track shaft 13. In some examples, the first track groove may be a cambered track groove, like the first cambered track groove 223 shown in the figure, and may be grooves in other shapes, which is not limited in the disclosure. When the first supporting member 22 rotates relative to the first transmission assembly 21, the first track shaft 13 may slide along the first cambered track groove 223. Through matching between the first cambered track groove 223 and the first track shaft 13, auxiliary guide and auxiliary limiting effects may be achieved on the first supporting member 22 during rotation, so as to further improve stability of the first supporting member 22 during rotation.

For example, in some examples, the first supporting member 22 is provided with a first track structure 222, and a side portion of the first track structure 222 in the first axial direction is provided with a first cambered track groove 223. The base plate 10 is provided with a first track shaft 13 parallel to the first axial direction, and the first track shaft 13 is arranged in the first cambered track groove 223. The first cambered track groove 223 may be adaptively provided according to a rotation track of the first supporting member 22 rotating relative to the first transmission assembly 21. When the first supporting member 22 rotates relative to the first transmission assembly 21, the first track shaft 13 may slide along the first cambered track groove 223 relative to the first track structure 222. Through matching between the first cambered track groove 223 and the first track shaft 13, auxiliary guide and auxiliary limiting effects may be achieved on the first supporting member 22 during rotation, so as to further improve stability of the first supporting member 22 during rotation. In some examples, a plurality of first track structures 222 may be arranged in a length direction of the first supporting member 22 at intervals, and match the first cambered grooves 215 of the fixing members 214 of the two first transmission assemblies 21 respectively. The base plate 10 may be provided with a plurality of first track shafts 13 corresponding to the plurality of first track structures 222, so as to improve stability of the first supporting member 22 during rotation. The structure of the first cambered track groove 223 may be a segment of cambered structure or a plurality of segments of cambered structure, which is determined according to actual situations and is not limited in the disclosure.

When the first supporting member 22 is assembled to the first transmission assembly 21, the first transmission assembly 21 is rotated to the main body 213 to be unfolded first, then the first track structure 222 of the first supporting member 22 is snapped to the first track shaft 13 of the base plate 10, and the first supporting member 22 is unfolded to be aligned with the main body 213. Then the first cambered structure 221 of the first supporting member 22 is snapped into the first cambered groove 215 of the fixing member 214, and the whole is fixed to the main body 213, so as to complete assembly.

Further, a surface of one side, close to the first supporting member 22, of the base plate 10 is provided with a second accommodating groove 17, the second accommodating groove 17 is a cambered groove, a bottom surface of the second accommodating groove 17 is a cambered bottom surface, and the first track shaft 13 is arranged on a side wall of the second accommodating groove 17. The first track structure 222 may be set as a cambered structure adapting to the second accommodating groove 17. The first track structure 222 is slidably arranged in the second accommodating groove 17, such that through adapting to between the first track structure 222 and the second accommodating groove 17, the first supporting member 22 may rotate relative to the base plate 10.

Those skilled in the art could easily conceive of other implementation solutions of the disclosure upon consideration of the description and the disclosure disclosed in the implementations. The disclosure is intended to cover any variations, uses or adaptive changes of the disclosure, which follow the general principles of the disclosure and include common general knowledge or customary technical means, which is not disclosed in the disclosure, in the art. The description and the examples are to be regarded as illustrative merely, and the true scope of the disclosure are indicated by the following claims.

It should be understood that the disclosure is not limited to a precise structure which has been described above and illustrated in the accompanying drawings, and may have various modifications and changes without departing from the its scope. The scope of the disclosure is limited by the appended claims.

The invention claimed is:

1. A rotary shaft apparatus, comprising:
   a base plate, comprising a first supporting plane;
   a rotary shaft assembly comprising a first transmission assembly, a second transmission assembly and a first supporting member; wherein the first transmission assembly is rotatably connected to the base plate around a first axial direction; wherein the first supporting member is rotatably connected to the first transmission assembly around a second axial direction parallel to the first axial direction, and is movably connected to the second transmission assembly, and the first supporting member comprises a second supporting plane; and wherein the second transmission assembly is rotatably connected to the base plate around a third axial direction parallel to the first axial direction; and
   a second supporting member, movably arranged on the base plate in a direction perpendicular to the first axial, and comprises a third supporting plane;
   wherein the rotary shaft apparatus has an unfolded state and a folded state;
   wherein, in the unfolded state, the second supporting member is at a first position, and the third supporting plane and the second supporting plane are on the same plane;
   wherein, in the folded state, the second supporting member is at a second position, a first preset included angle is between the second supporting plane and the first supporting plane, and the first supporting member and the second supporting member define a screen-accommodating space; and
   wherein, when the rotary shaft apparatus is switched from the unfolded state to the folded state, the second supporting member move from the first position to the second position closer to the base plate in the direction perpendicular to the first axial direction.

2. The rotary shaft apparatus according to claim 1, wherein the first transmission assembly comprises a main body and a fixing member detachably connected to the main body, the main body is rotatably connected to the base plate around the first axial direction, and the first supporting member is rotatably connected to at least one of the fixing member and the main body around the second axial direction.

3. The rotary shaft apparatus according to claim 2, wherein at least one of the main body and the fixing member has a first guide portion, and the first supporting member has a second guide portion in sliding fit with the first guide portion; or
   a first guide portion is jointly formed between the main body and the fixing member, and the first supporting member has a second guide portion in sliding fit with the first guide portion.

4. The rotary shaft apparatus according to claim 2, wherein the main body comprises a first structure portion and a second structure portion connected to the first structure portion, and the second structure portion is closer to the base plate than the first structure portion, wherein, one side, close to the first supporting member, of the first structure portion is provided with a first supporting surface, and one side, close to the first supporting member, of the second structure portion is provided with a second supporting surface;
   wherein the fixing member comprises a first fixing sub-member and a second fixing sub-member connected to the first fixing sub-member, and the second fixing sub-member is closer to the base plate than the first fixing sub-member, wherein, one side, close to the first supporting member, of the first fixing sub-member is provided with a third supporting surface flush with the first supporting surface, and one side, close to the first supporting member, of the second fixing sub-member is provided with a fourth supporting surface flush with the second supporting surface.

5. The rotary shaft apparatus according to claim 1, further comprising a rotary shaft cover, and the rotary shaft cover is on one side, away from the first supporting plane, of the base plate.

6. The rotary shaft apparatus according to claim 5, wherein the first transmission assembly has a first limiting structure, and at least one of the base plate and the rotary shaft cover has a second limiting structure in limiting fit with the first limiting structure.

7. The rotary shaft apparatus according to claim 6, wherein the first limiting structure comprises at least one of a limiting groove and a limiting portion, and the second limiting structure comprises at least one of a limiting groove and a limiting portion that adapt to the first limiting structure.

8. The rotary shaft apparatus according to claim 1, wherein the base plate has a first track shaft parallel to the first axial direction, and the first supporting member has a first track groove in sliding fit with the first track shaft; and/or
  one of the first supporting member and the second transmission assembly has a second track shaft parallel to the third axial direction, and the other one of the first supporting member and the second transmission assembly has a second track structure in sliding fit with the second track shaft.

9. The rotary shaft apparatus according to claim 1, wherein at least two rotary shaft assemblies are arranged, and at least one rotary shaft assembly is arranged on each of two sides of the base plate in a direction perpendicular to the first axial direction.

10. The rotary shaft apparatus according to claim 9, wherein at least one of the first transmission assembly and the second transmission assembly of the rotary shaft assembly on one side of the base plate has a first meshing member,
  at least one of the first transmission assembly and the second transmission assembly of the rotary shaft assembly on the other side of the base plate has a second meshing member meshing with the first meshing member, and
  the first meshing member on one side of the base plate is connected, in a meshing manner, to the second meshing member on the other side of the base plate, such that the rotary shaft assemblies positioned on the two sides of the base plate keep synchronously moving.

11. The rotary shaft apparatus according to claim 10, further comprising at least one linkage transmission pair connected, in a meshing manner, between the first meshing member and a corresponding second meshing member that are on the two sides of the base plate.

12. The rotary shaft apparatus according to claim 1, further comprising a damper abutting against at least one of the first transmission assembly and the second transmission assembly.

13. The rotary shaft apparatus according to claim 12, wherein the damper comprises a clamping plate and a first elastic member, the clamping plate abuts against at least one of the first transmission assembly and the second transmission assembly in a second direction, one end of the first elastic member abuts against the clamping plate, and the other end of the first elastic member abuts against the base plate.

14. The rotary shaft apparatus according to claim 13, wherein at least one of the first transmission assembly and the second transmission assembly has a first cam structure, the clamping plate has a second cam structure adapting to the first cam structure, and the second cam structure abuts against the first cam structure.

15. The rotary shaft apparatus according to claim 1, further comprising a third transmission assembly connected to the second supporting member and used for driving the second supporting member to move relative to the base plate.

16. The rotary shaft apparatus according to claim 15, wherein the third transmission assembly comprises a transmission member and a second elastic member connected to the transmission member; wherein one side of the transmission member is connected to one side, close to the base plate, of the second supporting member, and the other side of the transmission member is movably connected to the base plate; and wherein one end of the second elastic member is connected to the base plate, and the other end of the second elastic member is connected to the transmission member.

17. The rotary shaft apparatus according to claim 16, wherein the transmission member comprises a transmission portion and a connection portion;
  wherein one end of the connection portion is connected to one side, close to the base plate, of the second supporting member, and the other end of the connection portion is connected to the transmission portion;
  wherein the transmission portion is movably connected to the base plate; and
  wherein one end of the second elastic member is connected to the base plate, and the other end of the second elastic member is connected to the transmission member.

18. The rotary shaft apparatus according to claim 17, wherein the transmission portion is provided with a third guide portion, and one side, close to the second supporting member, of the base plate is provided with a fourth guide portion in guide fit with the third guide portion; and
  the second elastic member sleeves the fourth guide portion, one end of the second elastic member is connected to the fourth guide portion, and the other end of the second elastic member is connected to the transmission portion.

19. The rotary shaft apparatus according to claim 1, wherein the first transmission assembly has an abutting and pushing portion, and the abutting and pushing portion is used for driving, when the folded state is switched to the unfolded state, the second supporting member to move from the second position to the first position; and in the unfolded state, the abutting and pushing portion supports one side, close to the base plate, of the second supporting member.

20. A foldable electronic device, comprising:
  a rotary shaft apparatus, comprising:
  a base plate, comprising a first supporting plane,
  a rotary shaft assembly comprising a first transmission assembly, a second transmission assembly and a first supporting member; wherein the first transmission assembly is rotatably connected to the base plate around a first axial direction; wherein the first supporting member is rotatably connected to the first transmission assembly around a second axial direction parallel to the first axial direction, and is movably connected to the second transmission assembly, and the first supporting member comprises a second supporting plane; and wherein the second transmission assembly is rotatably connected to the base plate around a third axial direction parallel to the first axial direction; and
  a second supporting member, movably arranged on the base plate in a direction perpendicular to the first axial, and comprises a third supporting plane;
  a middle frame housing, the first transmission assembly being connected to the middle frame housing, and
  a flexible display screen, being connected to the middle frame housing;
  wherein the rotary shaft apparatus has an unfolded state and a folded state;
  wherein, in the unfolded state, the second supporting member is at a first position, and the third supporting plane and the second supporting plane are on the same plane;
  wherein, in the folded state, the second supporting member is at a second position, a first preset included angle is between the second supporting plane and the first supporting plane, and the first supporting member and the second supporting member define a screen-accommodating space; and wherein, when the rotary shaft apparatus is switched from the unfolded state to the folded state, the second supporting member move from the first position to the second position closer to the base plate in the direction perpendicular to the first axial direction.

* * * * *